United States Patent
Swanson

(10) Patent No.: US 6,255,975 B1
(45) Date of Patent: Jul. 3, 2001

(54) CIRCUITS AND METHODS FOR NOISE FILTERING IN 1-BIT AUDIO APPLICATIONS AND SYSTEMS USING THE SAME

(75) Inventor: Eric John Swanson, Buda, TX (US)

(73) Assignee: Cirrus Logic, Inc.

( * ) Notice: Subject to any disclaimer, the term of this patent is extended or adjusted under 35 U.S.C. 154(b) by 0 days.

(21) Appl. No.: 09/300,710

(22) Filed: Apr. 27, 1999

(51) Int. Cl.[7] ................ H03M 7/32; H03M 3/00
(52) U.S. Cl. ................ 341/143; 341/77
(58) Field of Search .................. 341/143, 141, 341/144, 155, 76, 152, 77; 375/355, 296, 240; 708/313; 379/339; 704/230

(56) References Cited

U.S. PATENT DOCUMENTS

| | | | |
|---|---|---|---|
| 5,144,306 | * 9/1992 | Masuda | 341/76 |
| 5,369,403 | * 11/1994 | Temes et al. | 341/143 |
| 5,493,297 | * 2/1996 | Nguyen et al. | 341/118 |
| 5,729,229 | 3/1998 | Kasha et al. | 341/122 |
| 5,732,107 | * 3/1998 | Phillips et al. | 375/296 |
| 5,812,207 | * 9/1998 | Cahill | 348/465 |
| 5,977,896 | * 11/1999 | Kohdaka et al. | 341/143 |

\* cited by examiner

*Primary Examiner*—Patrick Wamsley
(74) *Attorney, Agent, or Firm*—James J. Murphy; Winstead Sechrest & Minick

(57) ABSTRACT

A digital to analog converter 102 receives a data stream at a first over-sampling rate and quantizes a second data stream derived from that stream at a second, higher oversampling rate for reducing out-of-band quantization noise in an analog output of the digital to analog converter.

23 Claims, 2 Drawing Sheets

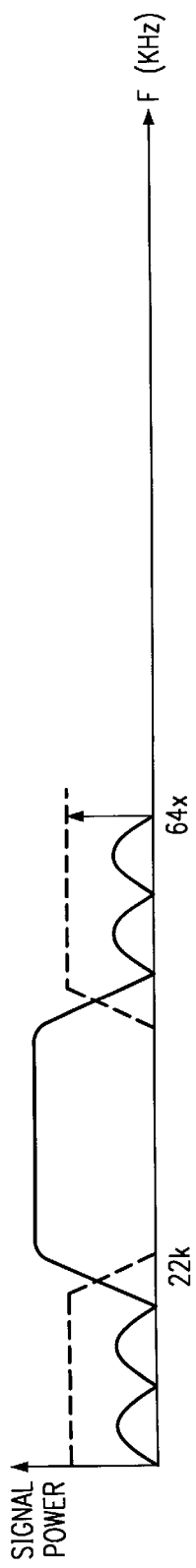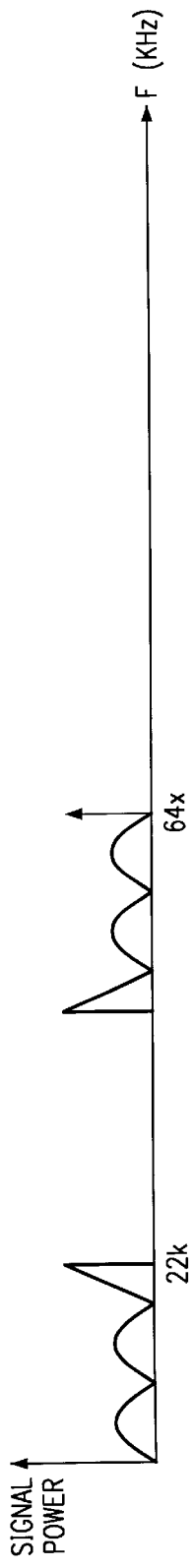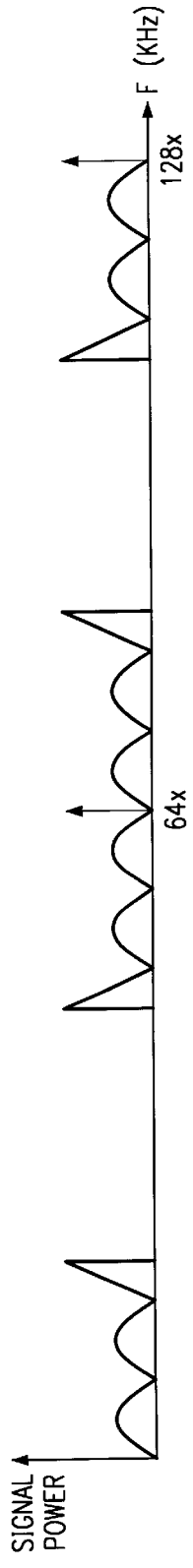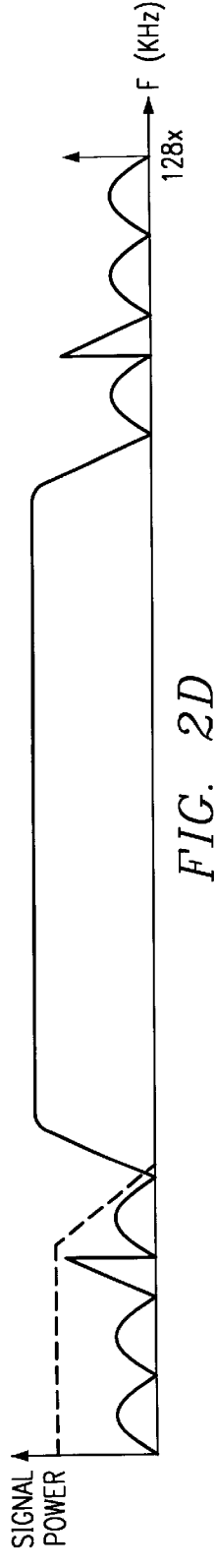

CIRCUITS AND METHODS FOR NOISE FILTERING IN 1-BIT AUDIO APPLICATIONS AND SYSTEMS USING THE SAME

BACKGROUND OF THE INVENTION

1. Field of the Invention

The present invention relates in general to digital signal processing and in particular to circuits and methods for noise filtering in 1-bit audio applications and systems using the same.

2. Description of the Related Art

Current digital audio systems record data on a compact disk (CD), digital audio tape (DAT) or digital video disk (DVD) in a 16-bit format. During playback, this data is typically passed through a 24-bit interpolation filter which smooths the incoming digital samples, increases the precision and increases the data sample rate. A delta-sigma modulator then quantizes the signal, shapes most of the noise power and moves the noise outside the audio band. The delta-sigma modulator also reduces the number of bits representing each sample, for example from 24-bit samples to 5-bit samples. The 5-bit data is then processed by dynamic element matching logic which insures that all bits in each sample are used equally by the following digital to analog converter by thermometer coding to 24 bits. The digital to analog converter which ultimately converts the digital data to analog for eventual presentation to the listener as audio is typically a switched-capacitor circuit that also provides filtering.

In the new Sony/Philips Super Audio Compact Disk (SACD) format, audio data is recorded on a high density optical disk using the Sony Direct Stream Digital (DSD) technology. Here, an oversampled delta-sigma modulator-based analog-to-digital converter (ADC) converts the analog audio streams being recorded into 64 fs (2.8224 MHz) 1-bit data streams, where fs, the sampling frequency, is the 44.1 kHz rate commonly used for CD recordings. Each 1-bit data stream is directly recorded as a channel on high density dual layer compact disk. One layer contains two-channel data to support existing CD players and the other contains six-channel data for surround sound applications. This is in contrast to existing PCM formats where the 1-bit resulting from A/D conversion is decimated into multiple bit PCM code and then recorded. The same 1-bit audio recording format can also be used with high density digital video disks (DVD).

A number of the intermediate steps can be eliminated in the DSD/SACD system at both the recording and playback stages. The system also proclaims of improved audio quality to the listener. As a result, techniques for converting data in the 1-bit digital format to analog in the corresponding CD players must be developed. This is a non-trivial problem since such factors as filtering out-of-band noise, gain control through the modulator, and hardware minimization must be considered. Moreover, it is usually a requirement that a dynamic range of −120 dB in the audio band be achieved.

Hence, given the potential for widely accepted use of the Sony/Philips 1-bit audio format, and the continuous demand for improved sound quality, circuits, systems and methods for digital to analog conversion of 1-bit audio data are required.

SUMMARY OF THE INVENTION

A digital to analog converter is disclosed which includes a delta sigma modulator for quantizing a data stream derived from a 1-bit data stream of a first selected oversampling rate at a second oversampling rate for reducing out-of-band quantization noise in the analog output of the digital to analog converter.

The principles of the present invention provide an efficient way to reduce out of band noise during digital to analog conversion. These principles are particularly useful in applications involving the Sony/Philip Super Audio Compact Disk and similar 1-bit digital audio formats.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A is a plot of the spectrum (frequency v. signal power) of the output from the optical disk;

FIG. 2B is a plot of the spectrum (frequency v. signal power) of the output of the optical disk following digital filtering at the input oversampling rate;

FIG. 2C is a plot of the spectrum (frequency v. signal power) of the filtered output from the digital filter following zero order hold; and FIG. 2D is a plot of the spectrum (frequency v. signal power) of the after zero order hold and delta sigma modulation at the increased oversampling rate.

DESCRIPTION OF THE PREFERRED EMBODIMENTS

Figure 1A:
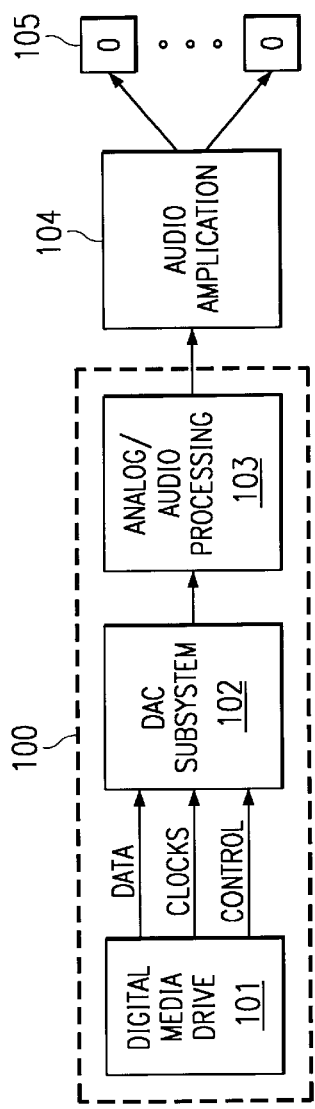
FIG. 1A is a diagram of the primary blocks of an optical disk-based entertainment system embodying the principles of the present invention.

FIG. 1A is a diagram of an exemplary system application of the Sony/Philips 1-bit Super Audio data format. For discussion purposes, assume that the encoded data is provided by an entertainment component 100, such as a compact disk (CD) player or digital video disk (DVD) unit. A digital media drive 102 recovers the necessary channels of 1-bit format data recorded on a high density dual layer optical disk in accordance with the Sony Direct Stream Digital (DSD) system. Two channels (left and right) of traditional stereo data may be recovered from one layer of disk or 6 channels (left, right, center, left surround, right surround and subwoofer) of surround sound data may be recovered from the second layer.

The recovered 1-bit DSD data streams are passed on to digital to analog converter (DAC) 102. DAC 102 will be discussed in detail below, but in general performs noise shaping, filtering and ultimately recovers the recorded analog signal. The analog output undergoes further filtering and amplification by analog processing block 103 prior to connection to a system audio amplifier 104 and system speakers 105.

Figure 1B:
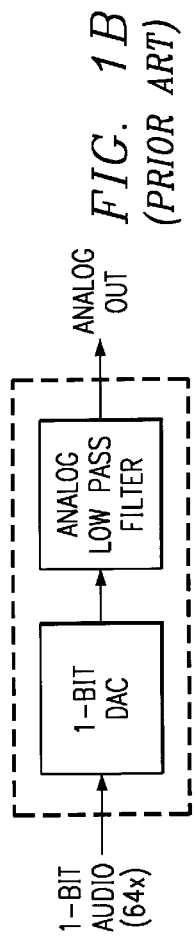
FIG. 1B is a diagram of the primary blocks of a prior art digital to analog converter for use in processing 1-bit digital audio data.

A prior art digital to analog converter subsystem utilized for converting 1-bit audio data streams into analog form is shown in FIG. 1B. Here the 64× oversampled 1-bit stream is directly input to a 1-bit DAC. Single-bit DACs are known in the art, as discussed below. The oversampling rate remains at 64× times, and hence the corresponding quantization noise produced during recording remains the same relative to the audio band. A conventional analog low pass filter cuts off the noise just above the audio band.

Figure 1C:
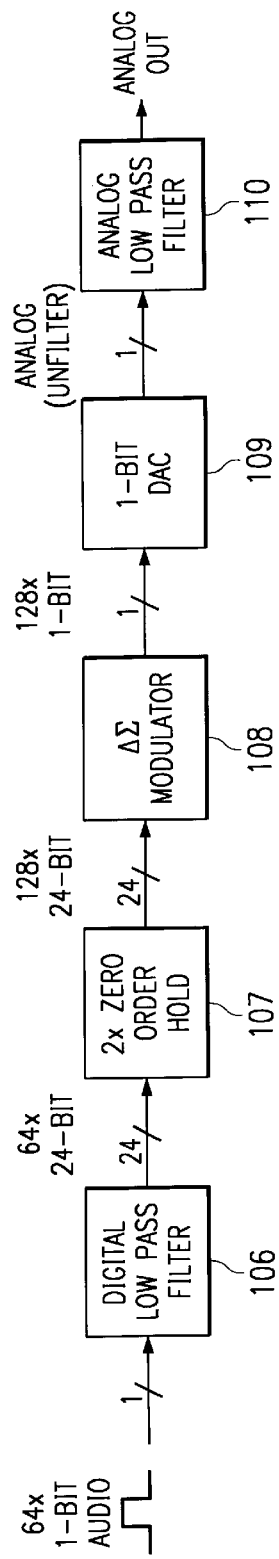
FIG. 1C is a diagram of the functional blocks of a digital to analog converter according to the inventive concepts and suitable for use in converting to analog from 1-bit digital data retrieved from optical disk.

FIG. 1C is a diagram of the major functional blocks of one processing path of a digital to audio converter (DAC) subsystem 102 fabricated on a single integrated circuit and embodying the present inventive concepts. In multiple channel processing, such as conventional L-R stereo or 6-channel surround sound audio, one such path is provided per channel.

The 64× oversampled 1-bit stream retrieved from optical disk is received at the input of a low pass filter 106. The spectrum of this stream is generally shown in FIG. 2A. As can be seen, two peaks and two zeroes appear in the baseband (e.g. 0–22 KHz), as a result of the direct recording of delta sigma modulated 1-bit data, after which the quantization noise increases rapidly and then continues on until the image is approached at the 64 Fs frequency and noise drops off. For the case of 64× oversampled data, the rapid increase in quantization noise occurs shortly after the upper end of the audio band (i.e. approximately 22 kHz or ½fs) (64× oversampling is generally a low oversampling ratios for 1-bit audio). As a result, the transition between the passband and stopband of filter 106 must be relatively sharp.

One note about the spectra depicted in FIGS. 2A–2D. In the audio band, thermal noise dominates while quantization noise dominates at the higher frequencies. For clarity, the thermal noise components of the spectrums of FIGS. 2A–2D have been removed. In actual practice, for example when analyzed using a spectrum analyzer, the zeroes and peaks shown in these figures will be below the thermal noise floor and therefore not visible.

The dashed lines in FIG. 2A represent the idealized target response of filter 106 (the passband and stopband ripple have not been shown for clarity). Such a filter response can be achieved using a linear phase finite impulse response (FIR) filter. In the illustrated embodiment, filter 106 is a high-order FIR filter outputting a stream of 24-bit data to the next processing stage. The spectrum of the 64× oversampled 24-bit output from filter 104 is shown in FIG. 2B.

The output from filter 106 is then passed through a 2× zero order hold (ZOH) 107. In this embodiment, ZOH 107 doubles the number of samples thereby increasing the oversampling rate to 128×. It should be recognized however that the sampling rate could be increased even higher, the advantage of which will become apparent as this discussion progresses. The spectrum of the 128× oversampled 24-bit output from ZOH is shown in FIG. 2C. It also should be noted that digital filter 106 and ZOH 107 may be switched in alternate embodiments; however, the illustrated configuration requires a less intensive filter design.

A delta sigma modulator 108 requantizes the 128× 24-bit stream to a 1-bit 128× 1-bit stream having the spectrum generally shown in FIG. 2D. Delta sigma 108 modulator is preferably of an order of 4 or higher. In the illustrated embodiment, modulator 108 has four zeros in the baseband. The number and location of the zeros, as well as the amplitudes of the noise power peaks, will vary from embodiment depending on the design of the modulator as is known in the art. The result of the requanization is the translation of the out-of-band quantization noise to an even higher frequency. This in turn allows the passband to stopband transition of the following analog low pass filter 110 to be less sharp (i.e., a lower order filter can be used). Analog low pass filter 110 is applied after a conventional 1-bit digital to analog conversion by DAC 109. Single bit DACs are described in coassigned documents such as U.S. Pat. No. 5,729,229 to Kasha et al., issued Mar. 17, 1998 and entitled "DATA INDEPENDENT LOADING OF A REFERENCE IN A SAMPLED DATA INTEGRATOR". In other words, an additional octave is provided for filter transition band roll-off before the out-of-band quantization noise rapidly increases. An idealized possible response for analog LPF 110 is shown in dashed lines in FIG. 2D.

In sum, the principles of the present invention are applied as follows. A 64-bit 1-bit audio data stream is received, filtered to remove noise up to a specified frequency, and then passed through an delta-sigma modulator at an even higher oversampling rate, in this case 128×, to shift the remaining noise further out-of-band. This higher frequency noise is more easily filtered out.

Although the present invention and its advantages have been described in detail, it should be understood that various changes, substitutions and alterations can be made herein without departing from the spirit and scope of the invention as defined by the appended claims.

What is claimed is:

1. A digital to analog converter for converting a single-bit digital data stream of a first selected oversampling rate into analog form comprising a delta sigma modulator for requantizing a data stream of multiple-bit data derived from said single-bit stream at a second, higher oversampling rate for reducing out-of-band quantization noise in an analog output of the digital to analog converter.

2. The digital to analog converter of claim 1 wherein and said converter further comprises a filter receiving a the single-bit stream and outputting said multiple bit data stream in response.

3. The digital to analog converter of claim 1 wherein said first oversampling rate is 64 times a sampling frequency associated with said data stream.

4. The digital to analog converter of claim 1 and further comprising a zero order hold circuit for converting said stream from said first oversampling rate to said second oversampling rate.

5. The digital to analog converter of claim 1 and further comprising a converter for converting a 1-bit quantized data stream output from said delta sigma modulator to analog form.

6. An audio processing device comprising:
    a digital low pass filter for filtering noise from a 1-bit data stream and outputting a multiple-bit data stream in response; and
    a delta-sigma modulator for quantizing the multiple-bit stream at a higher oversampling rate to a 1-bit data stream having quantization noise at a higher frequency.

7. The audio processing device of claim 6 wherein the digital low pass filter comprises a finite impulse response filter.

8. The audio processing device of claim 6 wherein the delta sigma modulator is of an order of at least 3.

9. The audio processing device of claim 6 and further comprising a 1-bit digital to analog converter for converting the 1-bit data stream from the modulator into analog data.

10. The audio processing device of claim 9 and further comprising an analog low pass filter having a response selected to filter the analog data having noise components shifted to a higher frequency by the modulator.

11. The audio processing device of claim 10 wherein said device is fabricated on a single integrated circuit chip.

12. An audio system comprising:
    a source of a plurality of 1-bit data streams recorded at a first oversampling rate each representing an audio channel; and
    a digital to analog converter subsystem including a plurality of paths each for converting a corresponding one of the 1-bit data streams retrieved from said source into an audio signal, each path comprising:
        a delta sigma modulator for Lequantizing a multiple-bit data stream derived from said corresponding 1-bit stream at a second oversampling rate, said delta sigma modulator having output quantization noise at higher frequencies than quantization noise associated with the corresponding 1-bit stream.

13. The system of claim 12 wherein said source provides said plurality of single bit data streams in the Super Audio Compact Disk format.

14. The system of claim 12 wherein said plurality of data streams represent left and right stereo channels.

15. The system of claim 12 wherein said plurality of data streams represent a plurality of surround sound channels.

16. The system of claim 12 wherein said source comprises an optical disk.

17. The system of claim 12 wherein said source comprises a digital video disk.

18. The system of claim 12 wherein said source comprises a double layer high density optical disk.

19. A method for improving noise performance in an audio system operating on a 1-bit data stream comprising the steps of:
    increasing an oversampling rate of the 1-bit data stream;
    converting the 1-bit data stream into a multiple-bit data stream;
    requantizing the multiple-bit data stream at the increased oversampling rate into a requantized 1-bit data stream; and
    converting the requantized 1-bit data stream to an analog signal, the analog signal having reduced out-of-band quantization noise.

20. The method of claim 19 wherein said step of increasing the oversampling rate comprises the step of increasing the oversampling rate from 64 fs to 128 fs.

21. The method of claim 19 wherein said step of increasing the oversampling rate comprises the step of performing a zero order hold on the 1-bit data stream.

22. The method of claim 19 and further comprising the step of digitally filtering the 1-bit data stream to produce a multiple-bit data stream prior to said step of requantizing.

23. The method of claim 19 wherein said step of requantizing comprises the step of requantizing using a delta-sigma converter.

* * * * *